United States Patent
Kim et al.

(10) Patent No.: US 8,936,951 B2
(45) Date of Patent: Jan. 20, 2015

(54) METHOD OF MANUFACTURING SEMICONDUCTOR LASERS

(71) Applicant: Electronics and Telecommunications Research Institute, Daejeon (KR)

(72) Inventors: In Gyoo Kim, Daejeon (KR); Gyungock Kim, Daejeon (KR); Sang Hoon Kim, Daejeon (KR); Ki Seok Jang, Daejeon (KR); JiHo Joo, Goyang-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/776,428

(22) Filed: Feb. 25, 2013

(65) Prior Publication Data
US 2014/0105235 A1   Apr. 17, 2014

(30) Foreign Application Priority Data
Oct. 15, 2012 (KR) ................. 10-2012-0114259

(51) Int. Cl.
| | |
|---|---|
| H01L 21/00 | (2006.01) |
| H01S 5/30 | (2006.01) |
| H01S 5/026 | (2006.01) |
| H01S 5/32 | (2006.01) |
| G02B 6/12 | (2006.01) |
| H01S 5/02 | (2006.01) |
| H01S 5/042 | (2006.01) |

(52) U.S. Cl.
CPC ............. *H01S 5/3031* (2013.01); *H01S 5/026* (2013.01); *H01S 5/3223* (2013.01); *G02B 6/12004* (2013.01); *H01S 5/021* (2013.01); *H01S 5/0425* (2013.01); *Y10S 438/933* (2013.01)
USPC ............... 438/24; 438/29; 438/31; 438/44; 438/933; 372/44.01

(58) Field of Classification Search
USPC ......... 438/24, 25, 27, 29, 31, 32, 44, 47, 735, 438/739, 743, 756, 933, FOR. 291, 438/FOR. 398; 372/44.01
See application file for complete search history.

(56) References Cited

U.S. PATENT DOCUMENTS

| | | | |
|---|---|---|---|
| 7,596,158 | B2 | 9/2009 | Liu et al. |
| 2010/0068869 | A1* | 3/2010 | Vincent et al. ................ 438/479 |
| 2012/0226118 | A1* | 9/2012 | Delbeke et al. ............... 600/316 |
| 2012/0251033 | A1* | 10/2012 | Matsuoka et al. ................ 385/8 |
| 2012/0288228 | A1* | 11/2012 | Saito et al. ....................... 385/14 |
| 2012/0301994 | A1* | 11/2012 | Wendling et al. ............... 438/69 |
| 2013/0039664 | A1* | 2/2013 | Clifton et al. ................. 398/200 |

OTHER PUBLICATIONS

Rodolfo E. Camacho-Aguilera et al., "An electrically pumped germanium laser", Optics Express, May 7, 2012, pp. 11316-11320, vol. 20 No. 10, OSA.

* cited by examiner

*Primary Examiner* — Thanh V Pham

(57) ABSTRACT

Provided are a semiconductor laser and a method of manufacturing the same. The method includes: providing a substrate including a buried oxide layer; forming patterns, which includes an opening part to expose the substrate, by etching the buried oxide layer; forming a germanium single crystal layer in the opening part; and forming an optical coupler, which is adjacent to the germanium single crystal layer, on the substrate.

13 Claims, 15 Drawing Sheets

METHOD OF MANUFACTURING SEMICONDUCTOR LASERS

CROSS-REFERENCE TO RELATED APPLICATIONS

This U.S. non-provisional patent application claims priority under 35 U.S.C. §119 of Korean Patent Application No. 10-2012-0114259, filed on Oct. 15, 2012, the entire contents of which are hereby incorporated by reference.

BACKGROUND OF THE INVENTION

The present invention disclosed herein relates to a semiconductor laser and a method of manufacturing the same, and more particularly, to a semiconductor laser having a simplified manufacturing process and a method of manufacturing the same.

As the development of a complementary metal oxide semiconductor (CMOS) device faces data transfer rate and power consumption limits, a technique of realizing an optical-interconnection on a silicon wafer receives more attention now. As an optical transmitter, an optical receiving device, and an optical passive device have been developed through researches, they partially come to an application state. Recently, the development of a monolithic integrated germanium light source on a silicon substrate spur researches on a silicon photonic technique.

SUMMARY OF THE INVENTION

The present invention provides a semiconductor laser having a simplified manufacturing process and a method of manufacturing the same.

The present invention also provides a semiconductor layer monolithic-integrated with optical devices and a method of manufacturing the same Embodiments of the present invention provide methods of manufacturing a semiconductor laser including: providing a substrate including a buried oxide layer; forming patterns, which includes an opening part to expose the substrate, by etching the buried oxide layer; forming a germanium single crystal layer in the opening part; and forming an optical coupler, which is adjacent to the germanium single crystal layer, on the substrate.

In some embodiments, the germanium single crystal layer may be formed through selective epitaxial growth (SEG).

In other embodiments, the substrate may further include an upper silicon layer on the buried oxide layer; and the buried oxide layer may include a lower buried oxide layer on the substrate and an upper buried oxide layer between the lower buried oxide layer and the upper silicon layer.

In still other embodiments, the forming of the patterns having the opening to expose the substrate may include: forming a first pattern, which has a first opening part to expose the upper buried oxide layer, by etching the upper silicon layer; forming a second pattern, which has a second opening part to expose the lower buried oxide layer, by etching the upper buried oxide layer; and forming a third pattern, which has a third opening part to expose the substrate, by etching the lower buried oxide layer, wherein the germanium single crystal layer is formed in the third opening part.

In even other embodiments, the forming of the first, second, and third patterns may include forming the first, second, and third patterns by performing a photolithography process and an etching process on the upper silicon layer, the upper buried oxide layer, and the lower buried oxide layer.

In yet other embodiments, the forming of the first, second, and third patterns may include forming the first, second, and third patterns at the same time by performing a photolithography process on the upper silicon layer and sequentially etching the upper silicon layer, the upper buried oxide layer, and the lower buried oxide layer.

In further embodiments, the method may further include forming an ion implantation area in the substrate, wherein the ion implantation area is formed by performing an ion implantation process on the lower buried oxide layer exposed by the second opening part before the third pattern is formed after the second pattern is formed.

In still further embodiments, the method may further include forming protection patterns on the substrate, wherein the forming of the protection patterns includes: depositing a passivation layer on an entire surface of the substrate; and exposing a top surface of the germanium single crystal layer by patterning the passivation layer.

In even further embodiments, the method may further include forming a electrode on the substrate, wherein the forming of the electrode includes: depositing a conductive layer on a first surface of the substrate where the protection patterns are to be formed and a second surface of the substrate that faces the first surface of the substrate; and forming a first electrode and a second electrode by patterning the conductive layer, wherein the first electrode is formed on the second surface of the substrate and the second electrode is formed on the first surface of the substrate to be connected to the germanium single crystal layer.

In yet further embodiments, the forming of the protection patterns may include exposing a portion of the top surface of the substrate by patterning the passivation layer, and the exposed top surface portion of the substrate is disposed in the ion implantation area.

In much further embodiments, the method may further include forming a electrode on the substrate, wherein the forming of the electrode includes: depositing a conductive layer on the first surface of the substrate where the protection patterns are to be formed; and forming a first electrode and a second electrode by patterning the conductive layer, wherein the first electrode and the second electrode are formed on the first surface of the substrate; the first electrode is connected to the ion implantation area in the substrate; and the second electrode is connected to the germanium single crystal layer.

In still much further embodiments, the forming of the optical coupler may include: forming a mask pattern with an opening part on the substrate, the opening part defining an area where the optical coupler is to be formed; and forming an optical waveguide having a slope by anisotropically etching the upper silicon layer exposed by the opening part.

In even much further embodiments, the method may further include removing the mask pattern after the optical coupler is formed.

In other embodiments of the present invention, semiconductor lasers include: a substrate including a buried oxide layer and an upper silicon layer on the buried oxide layer; a germanium single crystal layer formed in the buried oxide layer; and an optical coupler formed on the substrate and spaced from the germanium single crystal layer, wherein the optical coupler includes an optical waveguide formed of the upper silicon layer.

In some embodiments, the semiconductor laser may further include a first electrode and a second electrode on the first surface of the substrate, wherein the first electrode is connected to the substrate, and the second electrode is connected to the germanium single crystal layer.

In other embodiments, the semiconductor laser may further include: a first electrode formed on the first surface of the substrate and connected to the germanium single crystal layer; and a second electrode formed on the second surface of the substrate that faces the first surface of the substrate.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 2A to 11B are views illustrating a method of manufacturing a semiconductor laser according to an embodiment of the present invention. FIG. 2A to 11A are sectional views taken along the line of A-A' of FIG. 1A. FIG. 2B to 11B are sectional views taken along the line of B-B' of FIG. 1B;

FIG. 13A is a sectional view taken along the line of C-C' of FIG. 12A. FIG. 13B is a sectional view taken along the line of D-D' of FIG. 12A.

DETAILED DESCRIPTION OF PREFERRED EMBODIMENTS

Figure 1A:
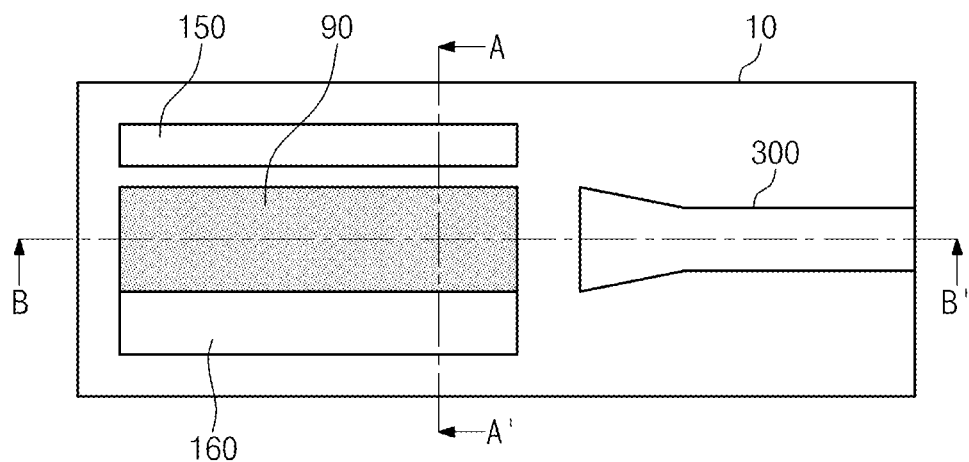
FIG. 1A is a plan view when a semiconductor laser manufactured according to an embodiment of the present invention is combined with an optical coupler.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, it will be described about an exemplary embodiment of the present invention in conjunction with the accompanying drawings.

Figure 1B:
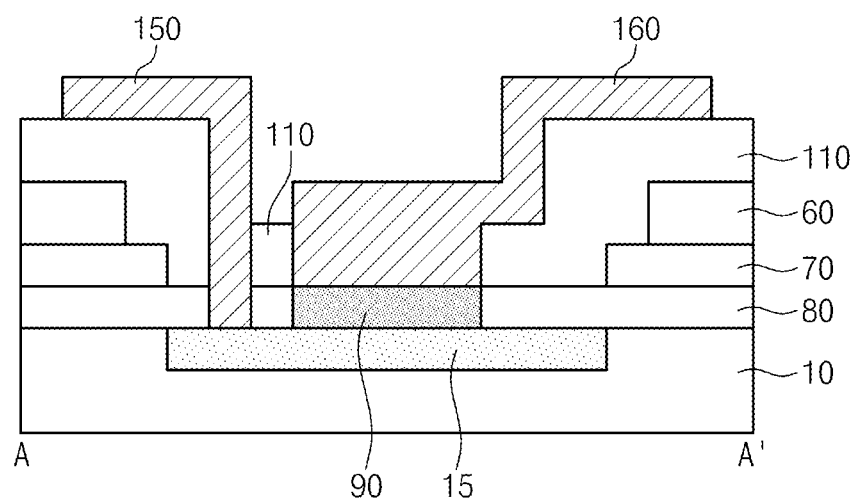
FIG. 1B is a sectional view taken along the line A-A' of FIG. 1A.
Figure 1C:
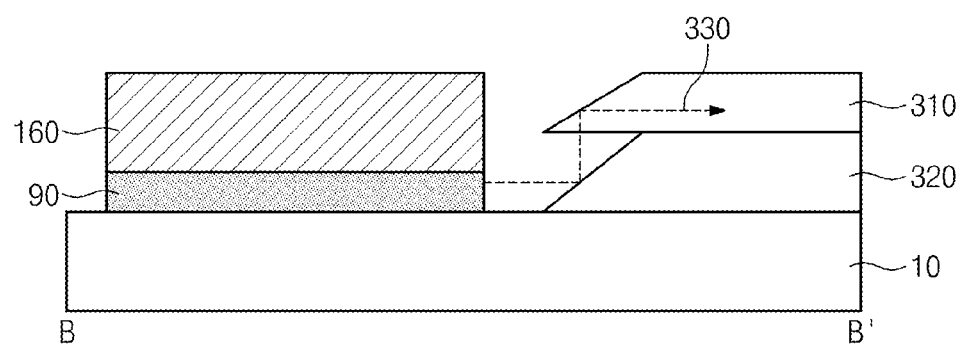
FIG. 1C is a sectional view taken along the line B-B' of FIG. 1A.

FIG. 1A is a plan view when a semiconductor laser manufactured according to an embodiment of the present invention is combined with an optical coupler. FIG. 1B is a sectional view taken along the line A-A' of FIG. 1A. FIG. 1C is a sectional view taken along the line B-B' of FIG. 1A.

Referring to FIGS. 1A to 1C, the semiconductor laser may be monolithic-integrated with the optical coupler 300. The semiconductor laser may include a germanium single crystal layer 90 formed on a silicon substrate 10 and first and second electrodes 150 and 160 formed on a first surface of the silicon substrate 10. The first electrode 150 may be spaced from the germanium single crystal layer 90, and the second electrode 160 may overlap the germanium single crystal layer 90. The semiconductor laser may include a first pattern 60 on the silicon substrate 10, a second pattern 70 between the silicon substrate 10 and the first pattern 60, and a third pattern 80 between the silicon substrate 10 and the second pattern 70. The semiconductor laser may include protection patterns 110 between the silicon substrate 10 and the electrodes 150 and 160 and an impurity implantation area 15 in the silicon substrate 10. The impurity implantation area 15 may overlap the germanium single crystal layer 90. In FIG. 1C, the first to third patterns 60, 70, and 80 and the protection patterns 110 are omitted to simplify the drawings. The optical coupler 300 may be spaced from the germanium single crystal layer 90. The optical coupler 300 may include an optical waveguide 310 on the silicon substrate 10 and a reflective pattern 320 between the silicon substrate 10 and the optical waveguide 310. The light 330 oscillated from the semiconductor laser is reflected at the slope of the reflective pattern 320, and progresses along the optical waveguide 310.

FIGS. 2A to 11B are views illustrating a method of manufacturing a semiconductor laser according to an embodiment of the present invention. FIG. 2A to 11A are sectional views taken along the line of A-A' of FIG. 1A. FIG. 2B to 11B are sectional views taken along the line of B-B' of FIG. 1B.

Figure 2A:
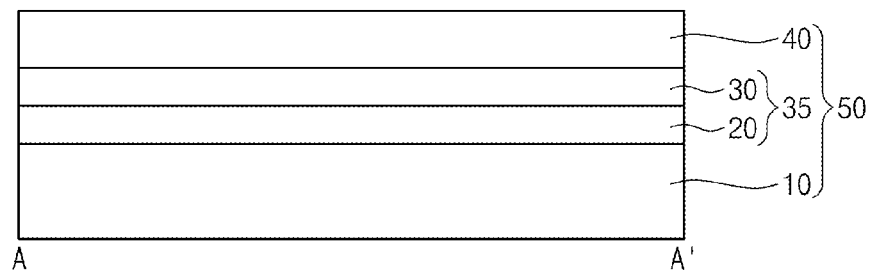
Figure 2B:
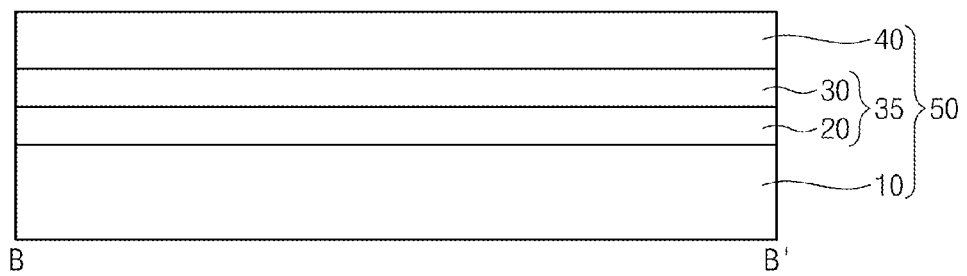

Referring to FIGS. 2A and 2B, a semiconductor substrate 50 is provided. The semiconductor substrate 50 may be a silicon-on-insulator (SOI) substrate. The semiconductor substrate 50 may include a silicon substrate 10, an upper silicon layer 40 on the silicon substrate 10, and a buried oxide layer 35 between the silicon substrate 10 and the upper silicon layer 40. The buried oxide layer 35 may include a lower buried oxide layer 20 on the silicon substrate 10 and an upper oxide layer 30 between the lower buried oxide layer 20 and the upper silicon layer 40.

Figure 3A:
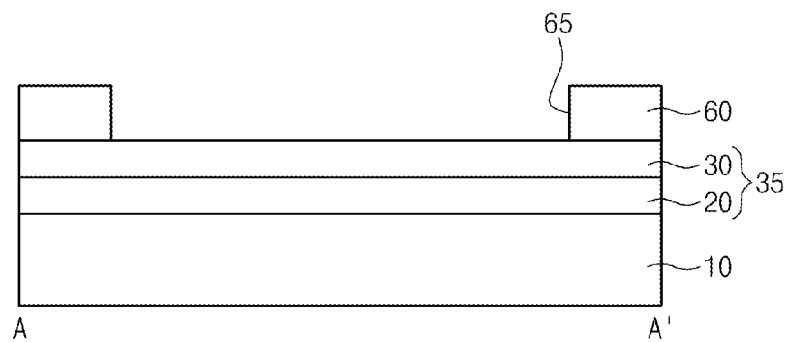
Figure 3B:
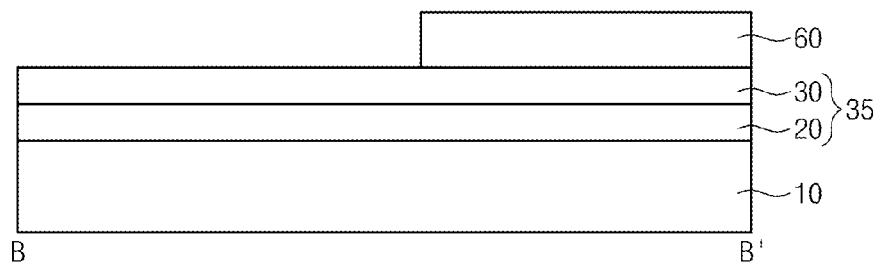

Referring to FIGS. 3A and 3B, a first pattern 60 having a first opening part 65 that exposes the upper buried oxide layer 30 may be formed by patterning the upper silicon layer 40. As one example, the first pattern 60 may be formed by performing a photolithography process and an etching process on the upper silicon layer 40. In FIG. 3B, a portion of the first pattern 60 is omitted to simplify the drawing.

Figure 4A:
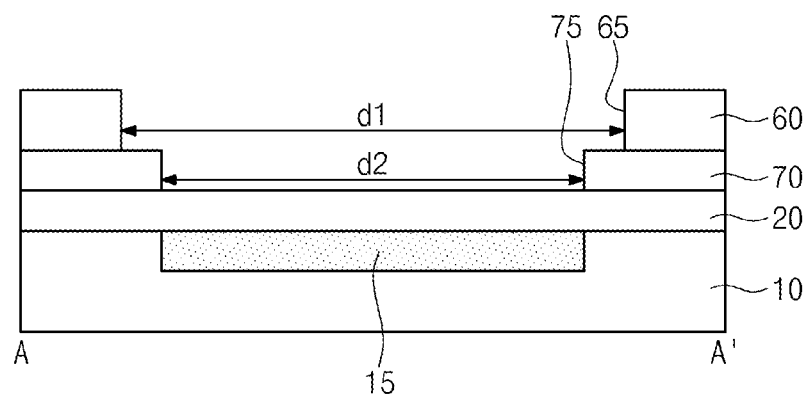
Figure 4B:
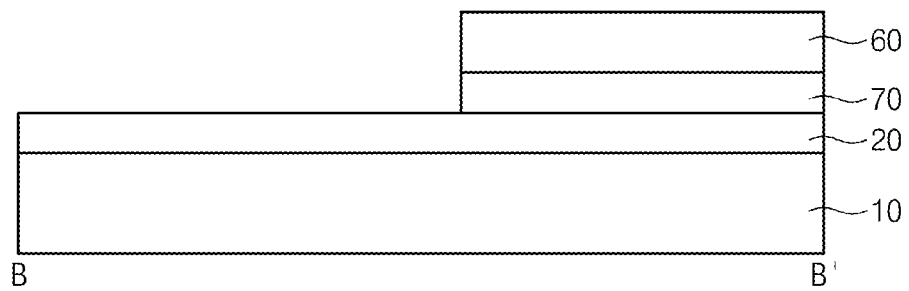

Referring to FIGS. 4A and 4B, by patterning the upper buried oxide layer 30 exposed by the first opening part 64, a second pattern 70 having a second opening part 75 that exposes the lower buried oxide layer 20 may be formed. As one example, the second pattern 70 may be formed by performing a photolithography process and an etching process on the upper buried oxide layer 30. The width d2 of the second opening part 75 may be less than or equal to that d1 of the first opening part 65. In FIG. 4B, portions of the first and second patterns 60 and 70 are omitted to simplify the drawing.

The second opening part 75 may define an impurity implantation area 15 in the silicon substrate 10. The second pattern 70 may be used as a mask of an ion implantation process. By performing an ion implantation process on the lower buried oxide layer 20 exposed by the second opening part 75, an impurity implantation area 15 may be formed in the silicon substrate 10. The lower buried oxide layer 20 may have a thickness at which impurities (for example, boron and phosphorus) are implanted into the silicon substrate 10 through an ion implantation process. The impurity implantation area 15 may have an N or P conductive type.

As described above, by using the second pattern 20 as a mask, an ion implantation process may be performed on the lower buried oxide layer 20 exposed by the second opening part 75. However, in another embodiment, when the silicon substrate 10 is highly doped with an N or P type, the ion implantation process may be omitted. As one example, an actually generated carrier concentration in the highly doped silicon substrate may be 1019 ea/cm3.

Figure 5A:
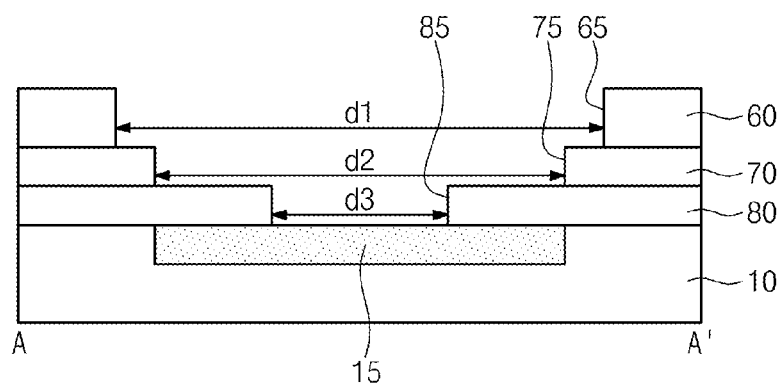
Figure 5B:
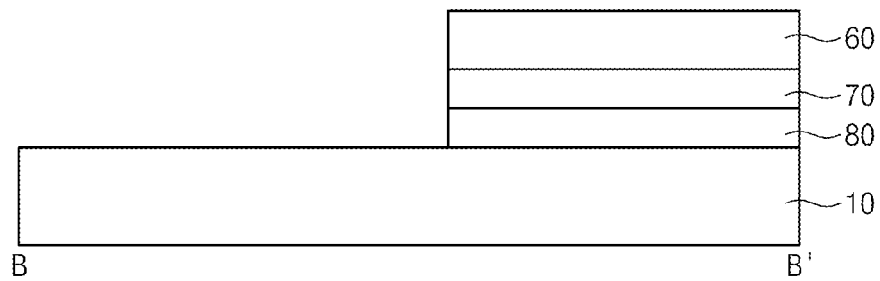

Continuously, referring to FIGS. 5A and 5B, by patterning the lower buried oxide layer 20 exposed by the second opening part 75, a third pattern 80 having a third opening part 85 that exposes the silicon substrate 10 may be formed. As one example, the third pattern 80 may be formed by performing a photolithography process and an etching process on the lower buried oxide layer 20. The width d3 of the third opening part 85 may be less than or equal to that d2 of the second opening part 75. The third opening part 85 may expose the impurity implantation area 15 in the silicon substrate 10. In FIG. 5B, portions of the first, second, and third patterns 60, 70, and 80 are omitted to simplify the drawing.

In an embodiment, the first, second, and third patterns 60, 70, and 80, as described with reference to FIGS. 2A to 5B, may be formed in stages by performing a photolithography process and an etching process on the upper silicon layer 40, the upper buried oxide layer 30, and the lower buried oxide layer 20. However, in another embodiment, the first, second, and third patterns 60, 70, and 80 may be formed at one time by performing a photolithograph process on the upper silicon layer 40 and sequentially etching the upper silicon layer 40 and the upper and lower buried oxide layers 30 and 20. In this case, the widths of the first, second, and third opening parts 65, 75, and 85 may be substantially same.

Figure 6A:
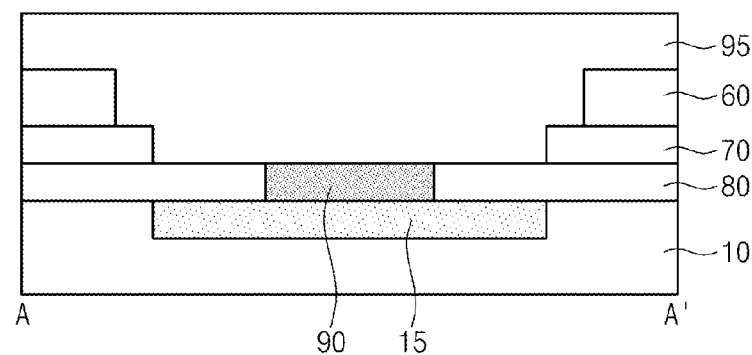
Figure 6B:
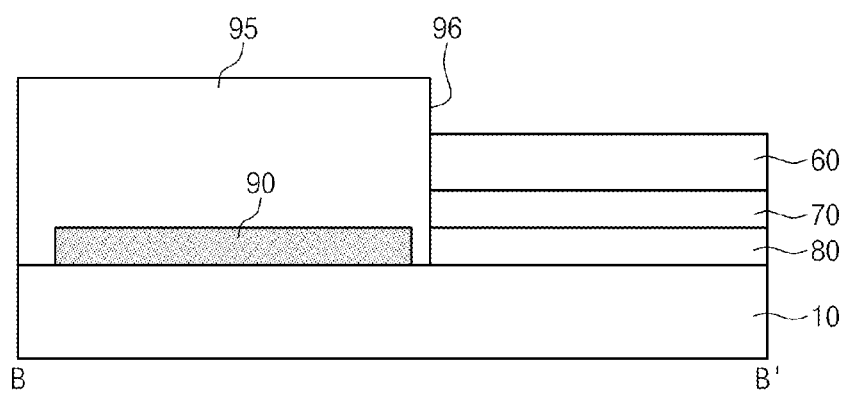

Then, referring to FIGS. 6A and 6B, a germanium single crystal layer 90, i.e. an active layer, may be formed in the third opening part 85. In FIG. 6B, portions of the first, second, and third patterns 60, 70, and 80 are omitted to simplify the drawing. The germanium single crystal layer 90 may be formed through selective epitaxial growth (SEG). The third opening part 85 may define an SEG area. The SEG may be realized through a reduced pressure chemical vapor deposition method or a low pressure chemical vapor deposition method. The SEG may use hydrogen gas as flow gas. The germanium source may include Germanium Tetrahydride (GeH4). The germanium single crystal layer 90 may be connected to the impurity implantation area 15.

Figure 7A:
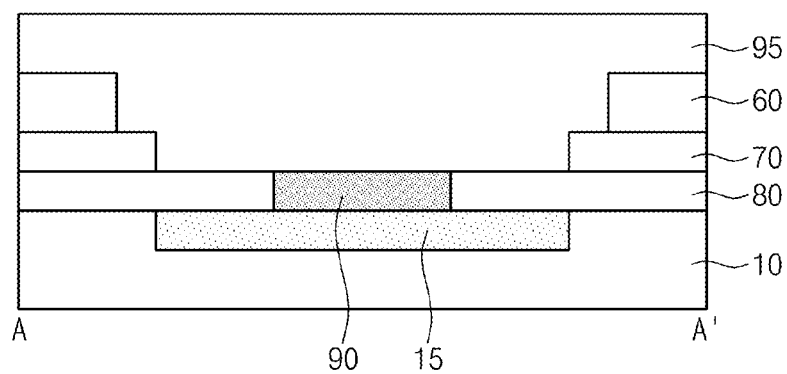
Figure 7B:
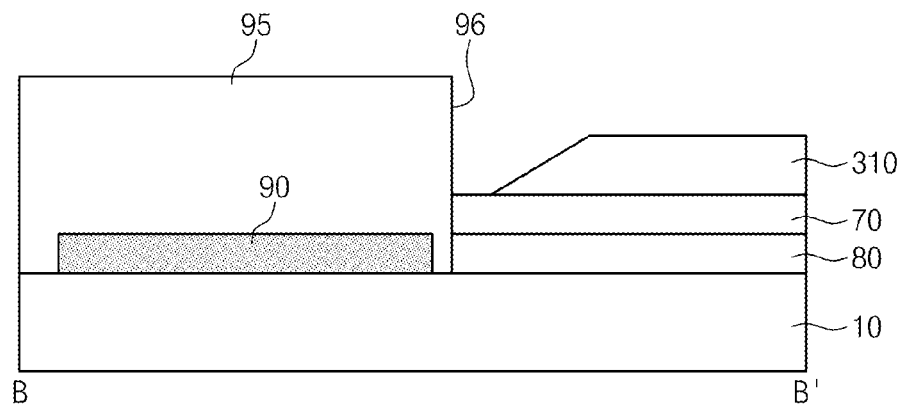
Figure 8A:
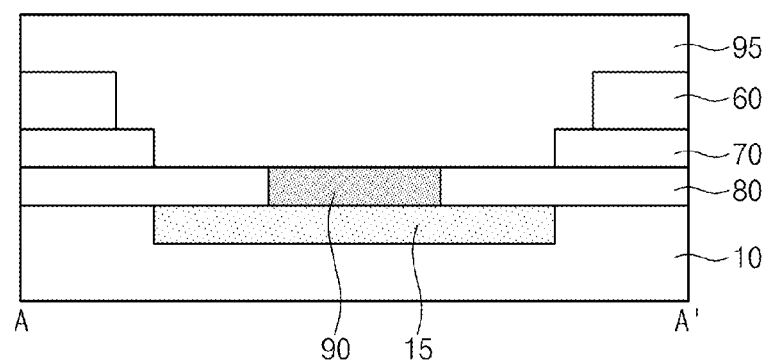
Figure 8B:
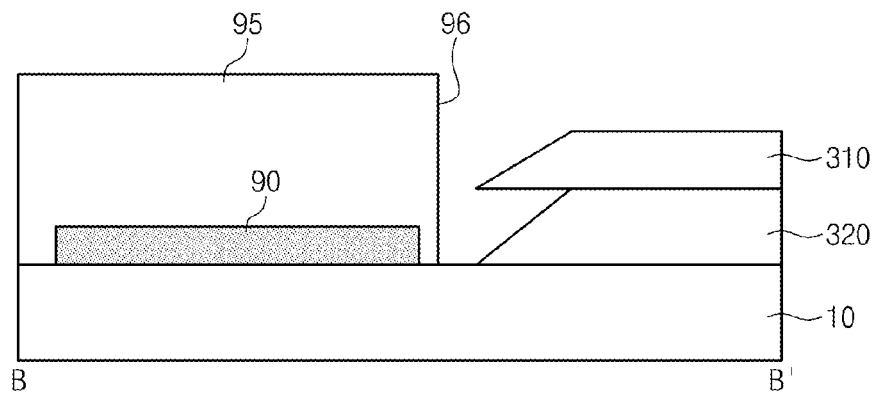

Before or after the germanium single crystal layer 90 is formed, the optical coupler 300 may be formed on the same substrate 10. As one example, referring to FIGS. 6A to 8B, a mask pattern 95 may be formed on the silicon substrate 10 having the germanium single crystal layer 90 formed thereon. The mask pattern 95 may include an opening part 96 that defines an area where the optical coupler 300 is to be formed. The mask pattern 95 may include an etch selectivity during an etching process for forming the optical coupler 300. By etching the first pattern 60 exposed by the opening part 96, the optical waveguide 310 may be formed. In more detail, the optical waveguide 310 having the slope, which is obtained by anisotropically etching the first pattern 60, may be formed. Then, the reflective pattern 320 having the slope, which is obtained by isotropically and anisotropically etching the second and third patterns 70 and 80, may be formed. In FIGS. 6B, 7B, and 8B, portions of the first, second, and third patterns 60, 70, and 80 are omitted to simplify the drawing.

Figure 9A:
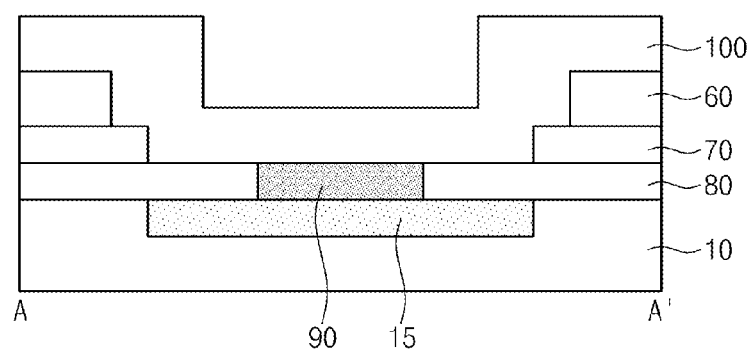
Figure 9B:
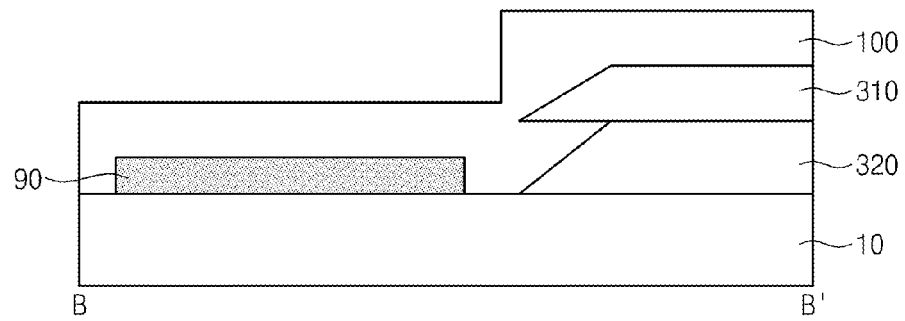

Referring to FIGS. 9A to 9B, a passivation layer 100 may be formed on the entire surface of the silicon substrate 10 having the germanium single crystal layer 90 formed thereon. When the mask pattern 95 is formed as described with reference to FIGS. 6A to 8B, the passivation layer 100 may be formed on the entire surface of the silicon substrate 10 after the mask pattern 95 is removed. As one example, the passivation layer 100 may be a silicon oxide layer deposited through low pressure chemical vapor deposition low temperature oxide (LPCVD LTO) or low pressure chemical vapor deposition tetraethyl orthosilicate (LPCVD TEOS). In FIG. 9B, portions of the first, second, and third patterns 60, 70, and 80 are omitted to simplify the drawing.

Figure 10A:
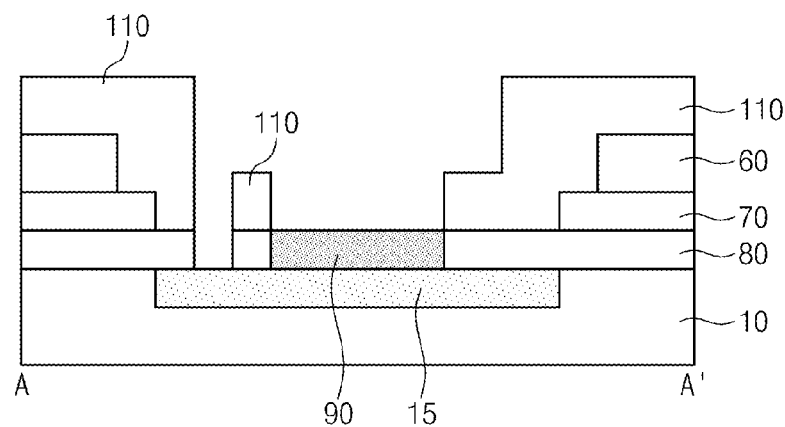
Figure 10B:
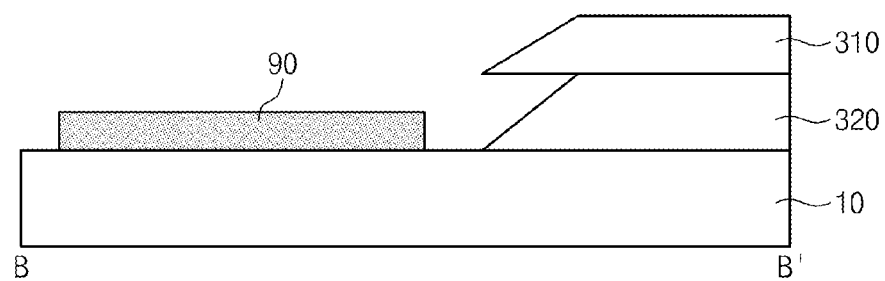

Referring to FIGS. 10A and 10B, protection patterns 110 may be formed by patterning the passivation layer 100. The protection patterns 110 may expose portions of the top surface of the germanium single crystal layer 90 and the top surface of the silicon substrate 10. A portion of the top surface of the exposed silicon substrate 10 may be disposed in the impurity implantation area 15. In FIG. 10B, portions of the first, second, and third patterns 60, 70, and 80 are omitted to simplify the drawing.

Figure 11A:
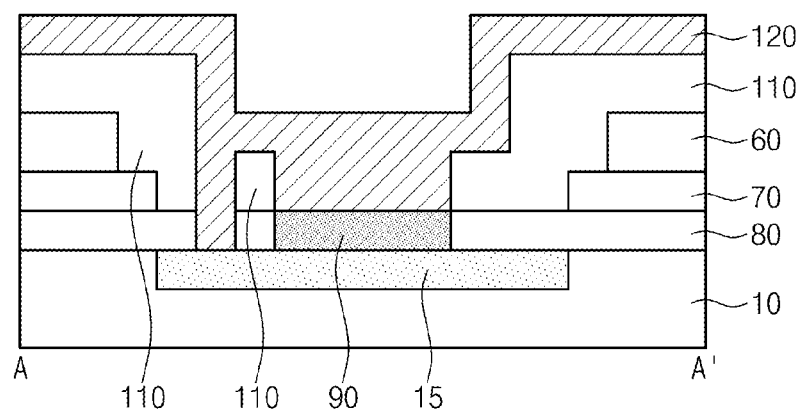
Figure 11B:
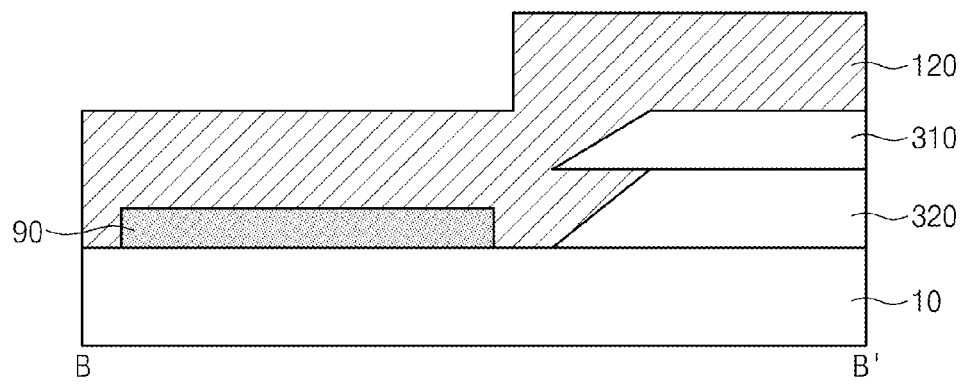

Referring to FIGS. 11A to 11B, a conductive layer 120 may be formed on the entire surface of the silicon substrate 10 having the protection patterns 110 formed thereon. The conductive layer 120 may be formed through a sputtering method, an electron-beam method, and a thermal evaporation method. The conductive layer 120 may include conductive material. As one example, the conductive layer 120 may be a multilayer formed of metal such as Pt/Au, Ti/Al, Ni/Au. In FIG. 11B, the first, second, and third patterns 60, 70, and 80 and the protection patterns 110 are omitted to simplify the drawing.

Referring to FIGS. 1B to 1C again, a first electrode 150 and a second electrode 160 may be formed by patterning the conductive layer 120. As one example, the first electrode 150 and the second electrode 160 may be formed by performing a photolithography process and an etching process on the conductive layer 120. According to an embodiment, the first electrode 150 and the second electrode 160 may be all disposed on the first surface of the silicon substrate 10, and may be spaced from each other by the protection patterns 110 therebetween. The first electrode 150 may be spaced from the germanium single crystal layer 90, and may be connected to the impurity implantation area 15 in the silicon substrate 10. The second electrode 160 may be connected to the germanium single crystal layer 90. When one of the first electrode 150 and the second electrode 160 serves as an anode, the other one serves as a cathode.

Figure 12A:
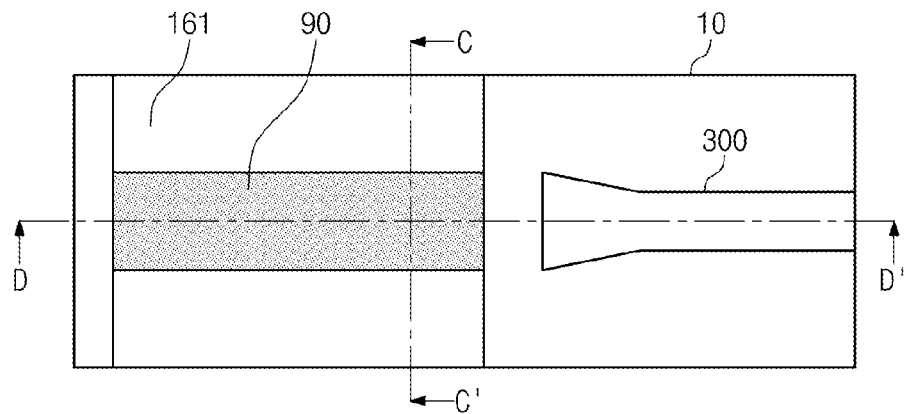
FIG. 12A is a plan view when a semiconductor laser manufactured according to another embodiment is combined with an optical coupler.
Figure 12B:
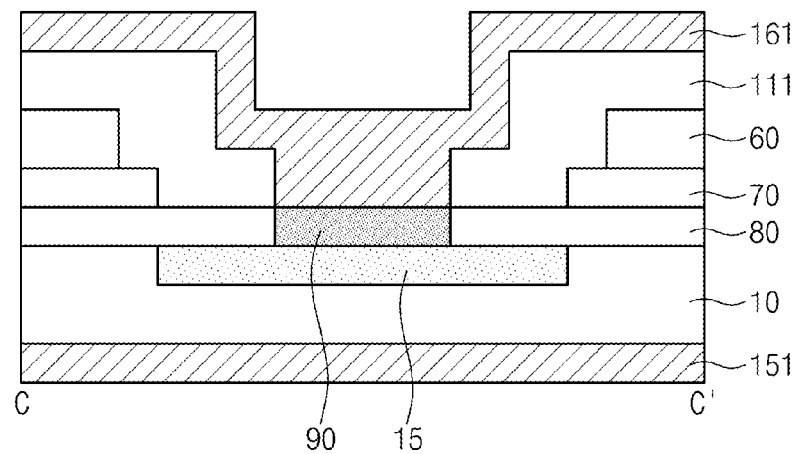
FIG. 12B is a sectional view taken along the line C-C' of FIG. 12A.
Figure 12C:
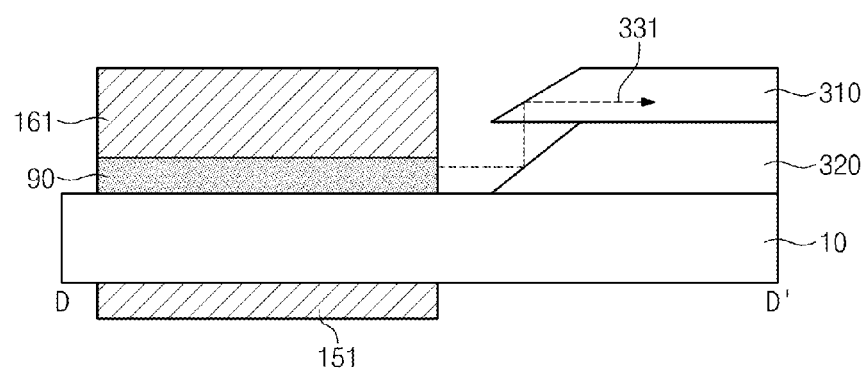
FIG. 12C is a sectional view taken along the line D-D' of FIG. 12A. Overlapping description may be omitted for conciseness.

FIG. 12A is a plan view when a semiconductor laser manufactured according to another embodiment is combined with an optical coupler. FIG. 12B is a sectional view taken along the line C-C' of FIG. 12A. FIG. 12C is a sectional view taken along the line D-D' of FIG. 12A. Overlapping description may be omitted for conciseness.

Referring to FIGS. 12A to 12C, the semiconductor laser may be monolithic-integrated with the optical coupler 300.

The semiconductor laser may include a germanium single crystal layer 90 formed on a silicon substrate 10 and first and second electrodes 151 and 161 formed on a first surface and a second surface opposite thereto of the silicon substrate 10. The first electrode 151 may be formed on the second surface of the silicon substrate 10, and the second electrode 161 may be formed on the first surface of the silicon substrate 10 and thus may overlap the germanium single crystal layer 90. In FIG. 12C, the first to third patterns 60, 70, and 80 and the protection patterns 111 are omitted to simplify the drawings. The optical coupler 300 may be spaced from the germanium single crystal layer 90. Before or after the germanium single crystal layer 90 is formed, the optical coupler 300 may be formed on the same substrate 10, and a specific method of manufacturing the optical coupler 300 is identical to that described with reference to FIGS. 6A to 8B. The light 331 oscillated from the semiconductor laser is reflected at the slope of the reflective pattern 320, and progresses along the optical waveguide 310.

Figure 13A:
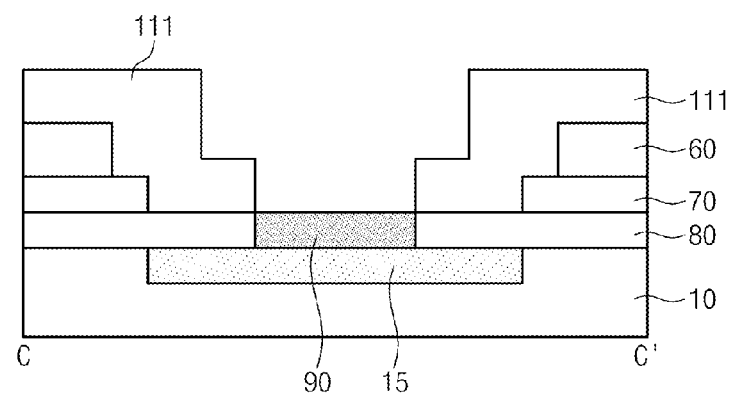
FIGS. 13A to 13B are views illustrating a method of manufacturing a semiconductor laser according to another embodiment of the present invention.
Figure 13B:
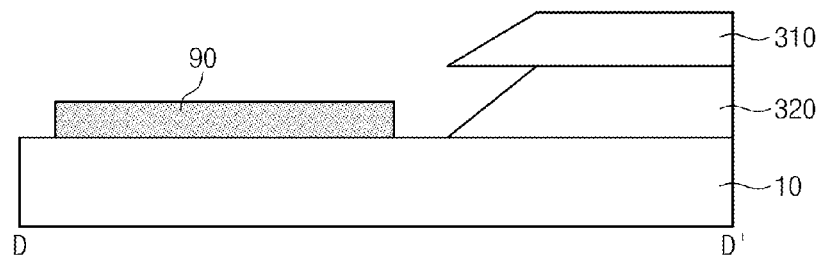

FIGS. 13A to 13B are views illustrating a method of manufacturing a semiconductor laser according to another embodiment of the present invention. FIG. 13A is a sectional view taken along the line of C-C' of FIG. 12A. FIG. 13B is a sectional view taken along the line of D-D' of FIG. 12A. In FIG. 13B, portions of the first, second, and third patterns 60, 70, and 80 and the protection patterns 111 are omitted to simplify the drawing. Overlapping description may be omitted for conciseness.

Referring to FIGS. 13A and 13B, protection patterns 111 may be formed by patterning the passivation layer 100 described with reference to FIGS. 9A and 9B. The protection patterns 111 may expose the top surface of the germanium single crystal layer 90.

Referring to FIGS. 12B and 12C, by depositing a conductive layer on the first surface of the silicon substrate 10 having the protection patterns 111 and the second surface opposite to the first surface of the silicon substrate 10 and patterning the deposited conductive layer, the first electrode 151 and the second electrode 161 may be formed. The first electrode 151 may be formed on the second surface of the silicon substrate 10, and the second electrode 161 may be formed on the first surface of the silicon substrate 10 having the protection patterns 111. The second electrode 161 may be connected to the germanium single crystal layer 90. When one of the first electrode 151 and the second electrode 161 serves as an anode, the other one serves as a cathode.

According to the concept of the present invention, when a semiconductor laser is manufactured by growing a germanium single crystal layer through an SEG method using a buried oxide layer in a SOI substrate, a process for depositing an additional mask layer and patterning it to define a SEG area may be omitted. Accordingly, manufacturing processes of a semiconductor laser may be simplified. Furthermore, the semiconductor laser may be monolithic-integrated with optical devices such as a silicon optical modulator, a passive waveguide device, and an optical detector, which are manufactured on a SOI substrate through a silicon photonics technique.

According to embodiments of the present invention, manufacturing processes of a semiconductor laser are simplified so that process efficiency is improved, and the semiconductor laser may be monolithic-integrated with optical devices manufactured with a silicon photonics technique on a SOI substrate.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing a semiconductor laser, the method comprising:
    providing a substrate including a buried oxide layer;
    forming patterns, which includes an opening part to expose the substrate, by etching the buried oxide layer;
    forming a germanium single crystal layer in the opening part; and
    forming an optical coupler, which is adjacent to the germanium single crystal layer, on the substrate.

2. The method of claim 1, wherein the germanium single crystal layer is formed through selective epitaxial growth (SEG).

3. The method of claim 1, wherein
    the substrate further comprises an upper silicon layer on the buried oxide layer; and
    the buried oxide layer comprises a lower buried oxide layer on the substrate and an upper buried oxide layer between the lower buried oxide layer and the upper silicon layer.

4. The method of claim 3, wherein the forming of the patterns having the opening to expose the substrate comprises:
    forming a first pattern, which has a first opening part to expose the upper buried oxide layer, by etching the upper silicon layer;
    forming a second pattern, which has a second opening part to expose the lower buried oxide layer, by etching the upper buried oxide layer; and
    forming a third pattern, which has a third opening part to expose the substrate, by etching the lower buried oxide layer,
    wherein the germanium single crystal layer is formed in the third opening part.

5. The method of claim 4, wherein the first, second, and third patterns are formed by performing a photolithography process and an etching process on the upper silicon layer, the upper buried oxide layer, and the lower buried oxide layer.

6. The method of claim 4, wherein the first, second, and third patterns are formed by performing a photolithography process on the upper silicon layer and sequentially etching the upper silicon layer, the upper buried oxide layer, and the lower buried oxide layer.

7. The method of claim 4, further comprising forming an ion implantation area in the substrate,
    wherein the ion implantation area is formed by performing an ion implantation process on the lower buried oxide layer exposed by the second opening part before the third pattern is formed and after the second pattern is formed.

8. The method of claim 7, further comprising forming protection patterns on the substrate,
    wherein the forming of the protection patterns comprises:
    depositing a passivation layer on an entire surface of the substrate; and
    exposing a top surface of the germanium single crystal layer by patterning the passivation layer.

9. The method of claim 8, further comprising forming an electrode on the substrate,
    wherein the forming of the electrode comprises:
    depositing a conductive layer on a first surface of the substrate where the protection patterns are to be formed and a second surface of the substrate that faces the first surface of the substrate; and
    forming a first electrode and a second electrode by patterning the conductive layer,
        wherein the first electrode is formed on the second surface of the substrate and the second electrode is formed on the first surface of the substrate to be connected to the germanium single crystal layer.

10. The method of claim 8, wherein the forming of the protection patterns comprises exposing a portion of a top surface of the substrate by patterning the passivation layer, and the exposed top surface portion of the substrate is disposed in the ion implantation area.

11. The method of claim 10, further comprising forming an electrode on the substrate, wherein the forming of the electrode comprises:

depositing a conductive layer on the first surface of the substrate where the protection patterns are to be formed; and forming a first electrode and a second electrode by patterning the conductive layer, wherein, the first electrode and the second electrode are formed on the first surface of the substrate, the first electrode is connected to the ion implantation area in the substrate, and the second electrode is connected to the germanium single crystal layer.

12. The method of claim 3, wherein the forming of the optical coupler comprises:

forming a mask pattern with a first opening part on the substrate, the first opening part defining an area where the optical coupler is to be formed; and forming an optical waveguide having a slope by anisotropically etching the upper silicon layer exposed by the first opening part.

13. The method of claim 12, further comprising removing the mask pattern after the optical coupler is formed.

* * * * *